United States Patent
Chen et al.

(10) Patent No.: US 10,199,532 B1
(45) Date of Patent: Feb. 5, 2019

(54) LIGHT-EMITTING DIODE AND METHOD FOR MANUFACTURING THE SAME

(71) Applicant: MIKRO MESA TECHNOLOGY CO., LTD., Apia (WS)

(72) Inventors: Li-Yi Chen, Tainan (TW); Hsin-Wei Lee, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 15/698,666

(22) Filed: Sep. 8, 2017

(51) Int. Cl.
*H01L 33/00* (2010.01)

(52) U.S. Cl.
CPC ...... *H01L 33/0045* (2013.01); *H01L 33/0008* (2013.01); *H01L 33/0025* (2013.01)

(58) Field of Classification Search
CPC ............. H01L 33/0045; H01L 33/0008; H01L 33/0025
See application file for complete search history.

(56) References Cited

U.S. PATENT DOCUMENTS

| | | | | |
|---|---|---|---|---|
| 8,063,397 | B2* | 11/2011 | Mori | H01L 33/30 257/18 |
| 9,184,342 | B1* | 11/2015 | Chang | H01L 33/44 |
| 2005/0184305 | A1* | 8/2005 | Ueda | H01L 33/08 257/99 |
| 2007/0085093 | A1* | 4/2007 | Ohmae | C30B 23/04 257/89 |
| 2009/0212277 | A1* | 8/2009 | Akita | B82Y 20/00 257/13 |
| 2009/0283028 | A1* | 11/2009 | Schowalter | H01L 21/02389 117/9 |
| 2010/0032644 | A1* | 2/2010 | Akita | H01L 33/06 257/13 |
| 2012/0258286 | A1* | 10/2012 | Amano | C30B 25/186 428/162 |
| 2013/0099202 | A1* | 4/2013 | Hardy | H01L 21/02389 257/14 |
| 2015/0207024 | A1* | 7/2015 | Grillot | H01L 33/007 257/13 |
| 2016/0064594 | A1* | 3/2016 | Chen | H01L 33/44 257/94 |
| 2016/0265138 | A1* | 9/2016 | Pernot | H01L 21/0242 |

* cited by examiner

*Primary Examiner* — Victor A Mandala
(74) *Attorney, Agent, or Firm* — CKC & Partners Co., Ltd.

(57) ABSTRACT

A light-emitting diode (LED) includes a first type semiconductor layer, a second type semiconductor layer, and an active layer. The first type semiconductor layer includes a low resistance portion and a high resistance portion. The low resistance portion is separated from at least one edge of the first type semiconductor layer by the high resistance portion, and the resistivity of the first type semiconductor layer is increased from the low resistance portion toward the high resistance portion. The active layer is disposed between the first type semiconductor layer and the second type semiconductor layer. The active layer has a first region and a second region, in which the first region has a threading dislocation density greater than that of the second region, and a vertical projection of the low resistance portion on the active layer at least partially overlaps with the second region.

18 Claims, 14 Drawing Sheets

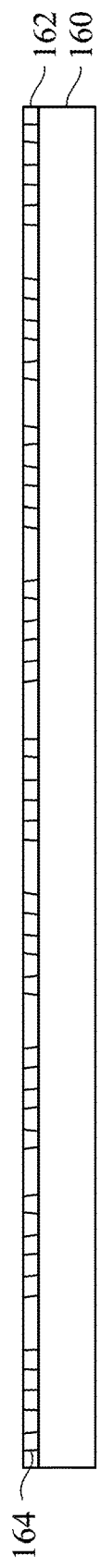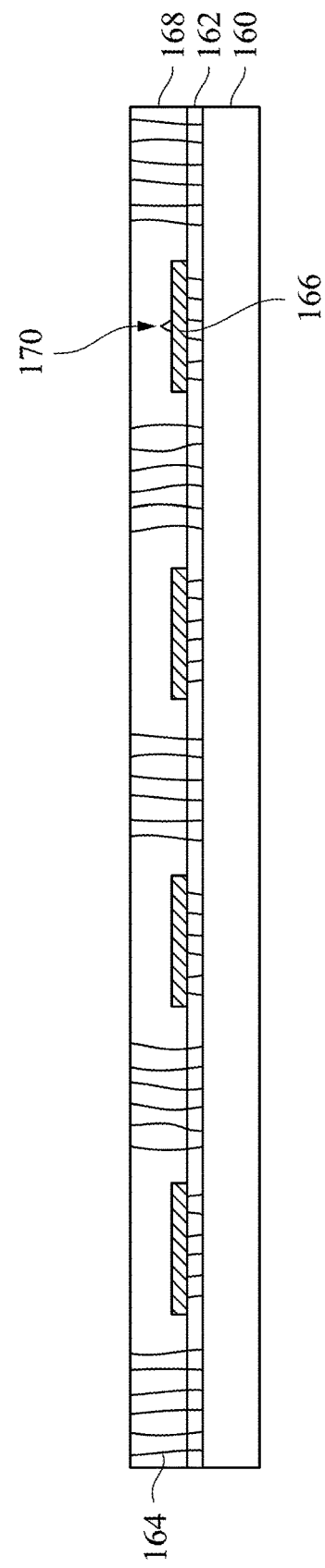

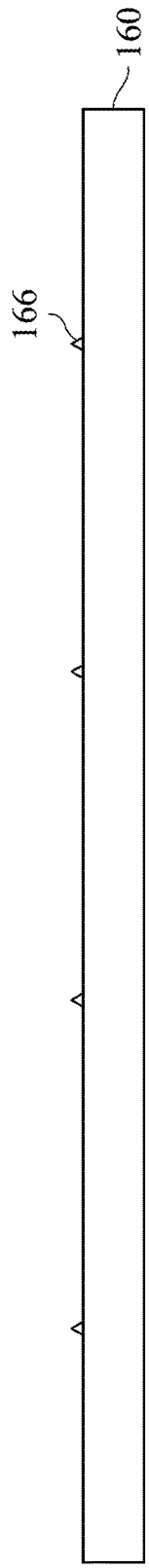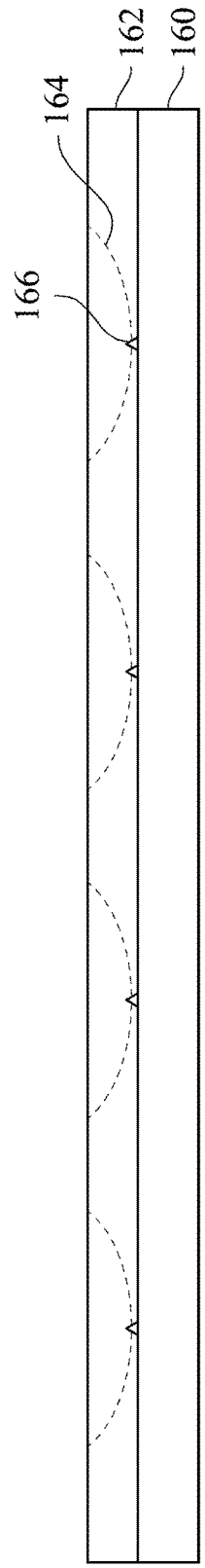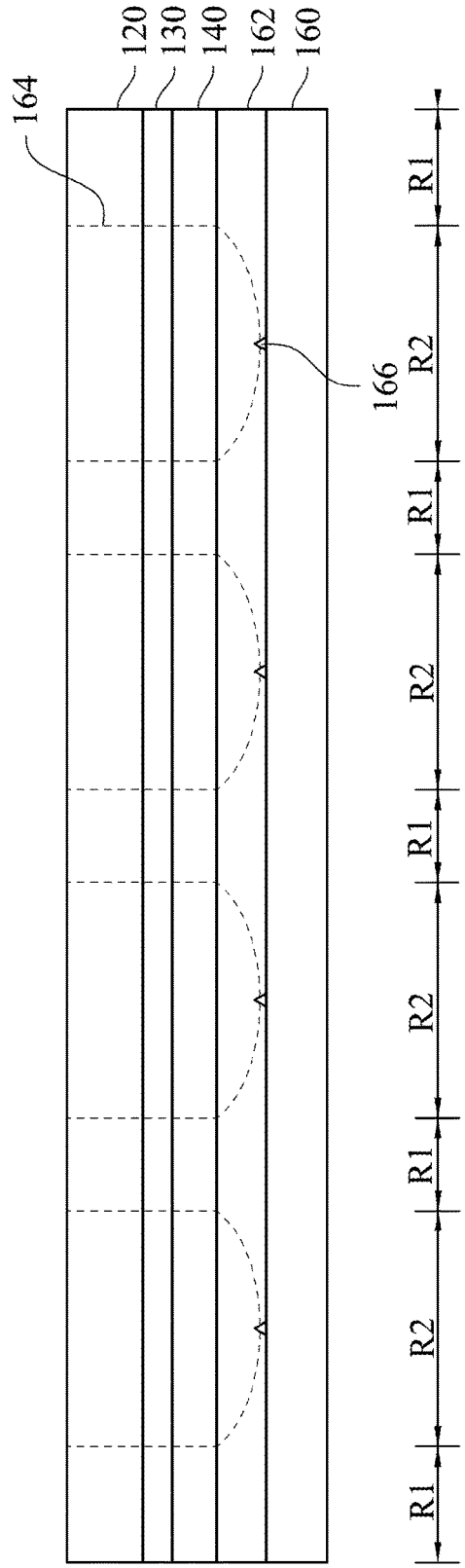

LIGHT-EMITTING DIODE AND METHOD FOR MANUFACTURING THE SAME

BACKGROUND

Technical Field

The present disclosure relates to light-emitting diodes (LEDs).

Description of Related Art

Light emitting diodes (LEDs) are semiconductor light-emitting devices which convert electricity into light energy. As being light sources, LEDs have advantages including low energy consumption, long lifetime, small size, and fast switching, and hence conventional illuminant technology, such as incandescent lamps, is gradually replaced by LEDs.

GaN (InGaN, AlGaN) based LEDs have become the majority of LED Illumination. However, the efficiency of GaN based LEDs may suffer from the threading dislocating defects in the epitaxy. Typically, threading defects are caused by the mismatch between the different lattice constants belong to the substrate and growth alloy respectively. Such threading dislocating defects in the emitting areas of LED devices may reduce efficiency and its stability.

SUMMARY

According to some embodiments of the present disclosure, a light-emitting diode (LED) includes a first type semiconductor layer, a second type semiconductor layer, and an active layer. The first type semiconductor layer includes a low resistance portion and a high resistance portion. The low resistance portion is separated from at least one edge of the first type semiconductor layer by the high resistance portion, and the resistivity of the first type semiconductor layer is increased from the low resistance portion toward the high resistance portion. The first type semiconductor layer is disposed on the second type semiconductor layer, and the active layer is disposed between the first type semiconductor layer and the second type semiconductor layer. The active layer has a first region and a second region, in which the first region has a threading dislocation density greater than that of the second region, and a vertical projection of the low resistance portion on the active layer at least partially overlaps with the second region.

According to some embodiments of the present disclosure, a method for manufacturing an LED includes following steps. At least one dislocation-controlling feature is formed on a substrate. A first type semiconductor layer is formed on the dislocation-controlling feature. An active layer is formed on the first type semiconductor layer, in which the active layer has a first region and a second region, and the dislocation-controlling feature causes a threading dislocation density of the first region to be greater than that of the second region. A second type semiconductor layer is formed on the active layer. The resistivity of the second type semiconductor layer is changed, so as to make the resistivity of second type semiconductor layer is increased from a low resistance portion toward a high resistance portion of the second type semiconductor layer.

BRIEF DESCRIPTION OF THE DRAWINGS

FIGS. 2A-2D are cross-sectional views of an LED at an intermediate stage of a method for manufacturing the same according to some embodiments of the present disclosure;

FIGS. 9A-9C are cross-sectional views of an LED at an intermediate stage of a method for manufacturing the same according to some embodiments of the present disclosure;

DETAILED DESCRIPTION

Figure 1A:
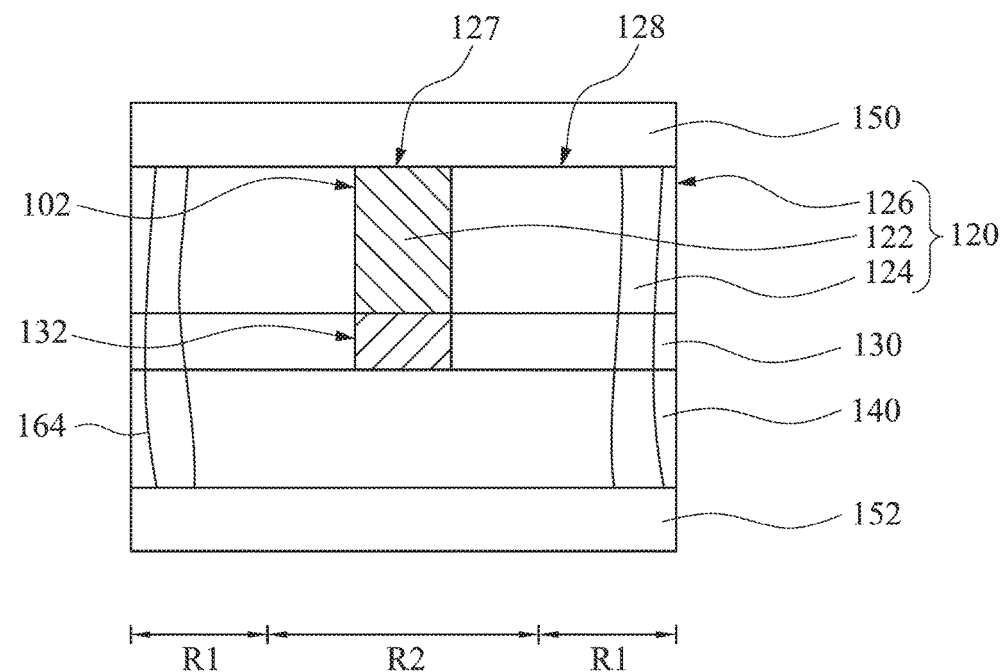
FIG. 1A is a cross-sectional view of a light-emitting diode (LED) according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1A is a cross-sectional view of a light-emitting diode (LED) 100A according to a first embodiment of the present disclosure. The LED 100A includes a first type semiconductor layer 120, an active layer 130, a second type semiconductor layer 140, a first electrode layer 150, and a second electrode layer 152. The first type semiconductor layer 120 is disposed over the second type semiconductor layer 140, and the active layer 130 is disposed between the first type semiconductor layer 120 and the second type semiconductor layer 140.

The first type semiconductor layer 120 includes a low resistance portion 122 and a high resistance portion 124. In some embodiments, the low resistance portion 122 is separated from an edge 126 of the first type semiconductor layer 120 by the high resistance portion 124, and resistivity of the first type semiconductor layer 120 horizontally increases from the low resistance portion 122 toward the high resistance portion 124.

The active layer 130 has a first region R1 and a second region R2. The first region R1 is formed with a plurality of threading dislocations 164 (the detailed information will be described thereafter), and the second region R2 has a threading dislocation density less than that of the first region R1. That is, the first region R1 has a threading dislocation density greater than that of the second region R2. A vertical projection of the low resistance portion 122 on the active layer 130 at least partially overlaps with the second region R2. The first electrode layer 150 is electrically coupled with the first type semiconductor layer 120, and surfaces of the low resistance portion 122 and the high resistance portion 124 facing away from the active layer 130 are covered with the first electrode layer 150. The second electrode layer 152 is electrically coupled with the second type semiconductor layer 140.

Since the resistivity of the first type semiconductor layer 120 horizontally increases from the low resistance portion 122 toward the high resistance portion 124, when the LED 100A is biased, charge carriers are apt to flow through the first type semiconductor layer 120 via the low resistance portion 122. Accordingly, at least one charge-carrier path 102 (i.e., a hatching area in the first type semiconductor layer 120) formed between the first electrode layer 150 and the active layer 130 at least partially overlaps with the low resistance portion 122. The charge-carrier path 102 defines a light-emitting zone 132 (i.e., a hatching area in the active layer 130) in the active layer 130. Therefore, a combination of the low resistance portion 122 and the high resistance portion 124 can confine an area where the current goes into the active layer 130, and hence the current density within the light-emitting zone 132 of the active layer 130 increases, thereby gaining the operating stability and efficiency of the LED 100A. Moreover, since a vertical projection of the low resistance portion 122 on the active layer 130 at least partially overlaps with the second region R2, the light-emitting zone 132 at least partially overlaps with the second region R2. That is, the active layer 130 can emit light within the second region R2, and therefore the luminous efficiency of the LED 100A can be further improved.

In addition, the boundary of the charge-carrier path 102 can vary in accordance with the magnitude of the current, and thus the boundary of the charge-carrier path 102 may be controllable and variable.

Figure 1B:
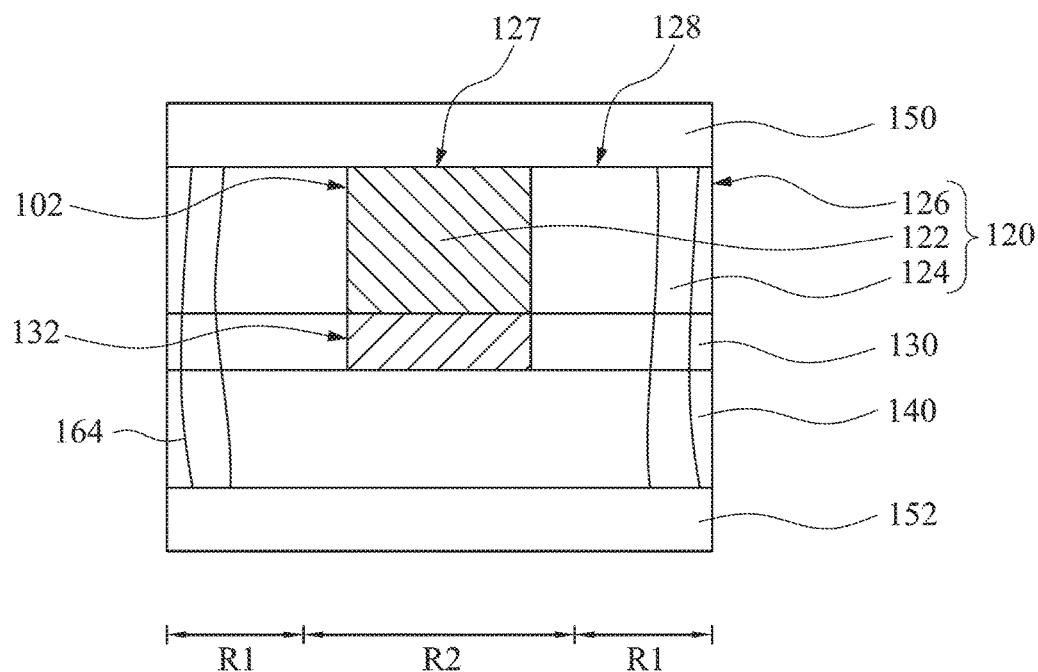
FIG. 1B is a cross-sectional view of the LED of the first embodiment, wherein the current passing through the LED is greater than that in FIG. 1A.

For example, FIG. 1B is a cross-sectional view of the LED 100A of the first embodiment, wherein the current passing through the LED 100A is greater than that in FIG. 1A. As shown in FIG. 1B, since the current passing through the LED 100A is greater than that in FIG. 1A, the charge-carrier path 102 of FIG. 1B may spread along a lateral direction to be wider than that of FIG. 1A.

Figure 1C:
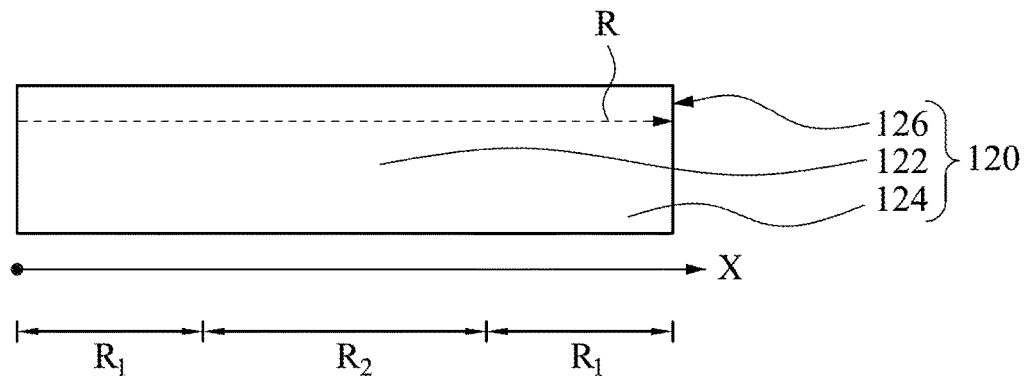
FIG. 1C is a cross-sectional view of the first type semiconductor layer of FIG. 1A with an x-axis X.
Figure 1D:
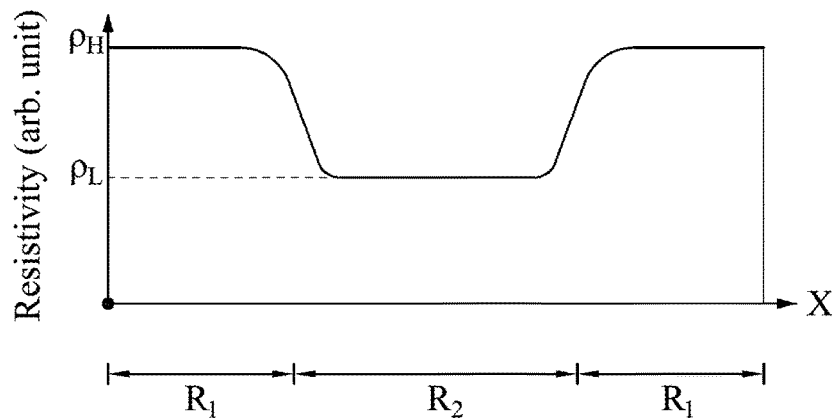
FIGS. 1D and 1E are graphs plotting relatively resistivity versus x-coordinate in the first type semiconductor layer of FIG. 1C.
Figure 1E:
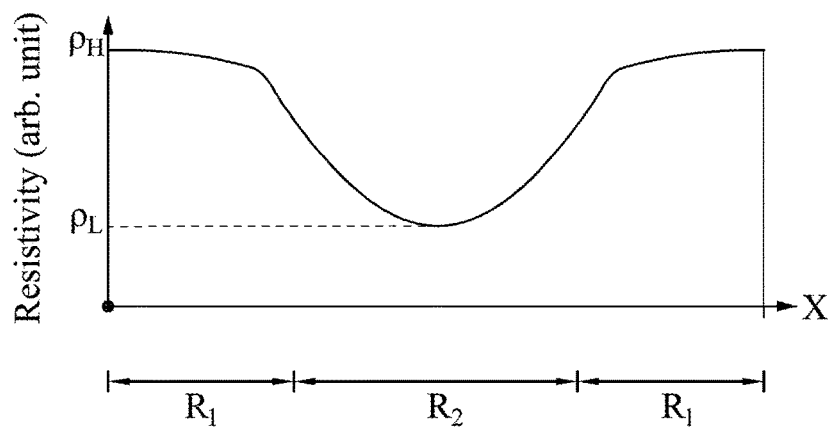

FIG. 1C is a cross-sectional view of the first type semiconductor layer 120 of FIG. 1A with an x-axis X. FIGS. 1D and 1E are graphs plotting relatively resistivity versus x-coordinate in the first type semiconductor layer 120 of FIG. 1C. In graphs of FIGS. 1D and 1E, each horizontal axis represents the x-axis X of FIG. 1C, each vertical axis represents the resistivity, and both of the x-axis and the resistivity are in arbitrary unit herein. Each curve plotted in FIGS. 1D and 1E represents the resistivity of the first type semiconductor layer 120 along the dot line R of FIG. 1C.

As shown in each curve of FIGS. 1D and 1E, a local minimum value of resistivity labeled as $\rho_L$ is present within the low resistance portion 122, and a local maximum value of resistivity labeled as $\rho_H$ is present within the high resistance portion 124. That is, as the resistivity of the first type semiconductor layer 120 gradually and horizontally increases from the low resistance portion 122 toward the high resistance portion 124, a local minimum value of the resistivity of the first type semiconductor layer 120 can be present within the low resistance portion 122. Furthermore, the curve of FIG. 1D shows that the resistivity sharply increases from the resistivity $\rho_L$ toward the resistivity $\rho_H$, and the curve of FIG. 1E shows that the resistivity gradually increases from the resistivity $\rho_L$ toward the resistivity $\rho_H$.

Reference is made back to FIG. 1A. In some embodiments, the vertical projection of the low resistance portion 122 on the active layer 130 can be surrounded by a vertical projection of the high resistance portion 124 on the active layer 130. By the increase of the resistivity from the low resistance portion 122 toward the high resistance portion 124, the charge-carrier path 102 can be separated from the edge 126 by the high resistance portion 124. Furthermore, the low resistance portion 122 has a top surface 127 facing away from the active layer 130, and the vertical projection of the top surface 127 of the low resistance portion 122 on the active layer 130 can be present within the second region R2, so as to confine the light-emitting zone 132 to be present within the second region R2.

In some embodiments, the high resistance portion 124 has a top surface 128 facing away from the active layer 130, and the resistivity of the high resistance portion 124 decreases from the top surface 128 toward the active layer 130. For example, in the first type semiconductor layer 120, the resistivity corresponding to the high resistance portion 124 near the top surface 128 is $\rho1$, the resistivity corresponding to the high resistance portion 124 near the active layer 130 is $\rho2$, and $\rho1 \geq \rho2$. In addition, the resistivity of the low resistance portion 122 is less than each of the resistivity $\rho1$ and resistivity $\rho2$, such that the lateral spreading of the charge carriers can be prevented, thereby increasing the efficiency of the LED 100A.

FIGS. 2A-2D are cross-sectional views of an LED at an intermediate stage of a method for manufacturing the same according to some embodiments of the present disclosure. The LED 100A of FIG. 1A can be manufactured by the following steps.

As shown in FIG. 2A, a buffer layer 162 is formed on a growth substrate 160. In some embodiments, several growth techniques may be used for growth of the buffer layer 162. In some embodiments, when the buffer layer 162 and the growth substrate 160 are made of different materials, it is apt to create lattice mismatch between the buffer layer 162 and the growth substrate 160. For example, a plurality of threading dislocations 164 arise from the growth substrate 160 into the buffer layer 162.

In some embodiments, the growth substrate 160 may be a bulk substrate including sapphire ($Al_2O_3$). In alternative embodiments, the growth substrate 160 may be formed of other suitable materials such as, Si, GaN, SiC, or GaAs. In some embodiments, the buffer layer 162 may be made of a material different from or the same as the growth substrate 160. In alternative embodiments, the buffer layer 162 may be a III-V compound semiconductor layer such as GaN, InN, AlN, InGaN, AlGaN, InAlGaN, and combinations thereof.

As shown in FIG. 2B, dislocation-controlling features 166 are formed on the buffer layer 162. Each of the dislocation-controlling features 166 is a dislocation-blocking feature, so as to configure to block the propagation of the threading dislocations 164. Then, an epitaxial lateral overgrowth (ELOG) layer 168 is formed on the buffer layer 162 and the dislocation-controlling features 166. In some embodiments, the ELOG layer 168 can be formed by epitaxy along a horizontal direction (parallel to the growth substrate 160). A void 170 may be formed on the dislocation-controlling features 166. In this regard, with adjusting the growth rate of the ELOG layer 168, the void 170 can be controlled. Furthermore, due to the dislocation-blocking features 166, the threading dislocations 164 may not propagate into some portions of the ELOG layer 168 which are present above the dislocation-blocking features 166.

Figure 2C:
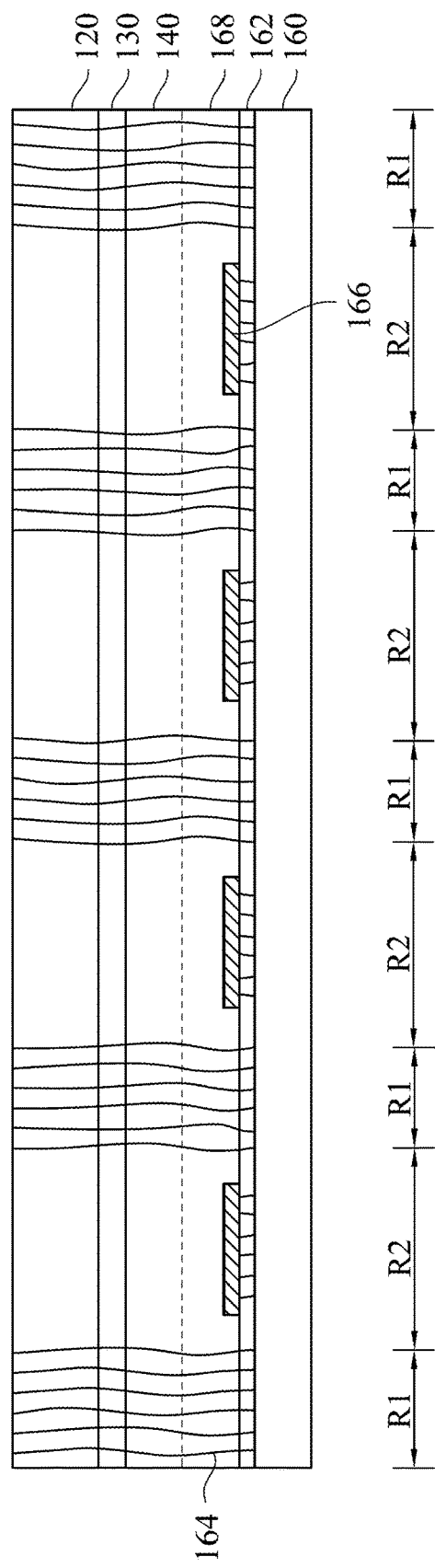

As shown in FIG. 2C, a second type semiconductor layer 140 is formed on the ELOG layer 168. An active layer 130 is formed on the second type semiconductor layer 140. A first type semiconductor layer 120 is formed on the active layer 130. In some embodiments, the second type semiconductor layer 140 and the ELOG layer 168 can be formed in the same process. In alternative embodiments, the second type semiconductor layer 140 and the ELOG layer 168 can be respectively formed in different processes. In some embodiments, there exists a distinguishable interface (i.e. the dot line as illustrated in FIG. 2C) between the second type semiconductor layer 140 and the ELOG layer 168. In alternative embodiments, the second type semiconductor layer 140 and the ELOG layer 168 may be merged with no distinguishable interface therebetween.

In some embodiments, the first type semiconductor layer 120 is made of a p-type doped semiconductor material, and the second type semiconductor layer is made of an n-type semiconductor material. In some embodiments, the first type semiconductor layer 120 is made of p-doped AlGaN/InGaN/GaN. Furthermore, hydrogen gas can be used in the formation of the first type semiconductor layer 120, and the hydrogen atoms may be present in the first type semiconductor layer 120.

Since the dislocation-controlling features 166 are capable of blocking the threading dislocations 164 from propagating into the upper layers, a first region R1 and a second region R2 are at least formed in the active layer 130. In the active layer 130, the first region R1 is formed with the threading dislocations 164, and the second region R2 has a threading dislocation density less than that of the first region R1. Therefore, the threading dislocation density of the first region R1 is greater than that of the second region R2.

In some embodiments, the buffer layer 162, the ELOG layer 168, and the second type semiconductor layer 140 can be formed respectively. That is, the buffer layer 162, the ELOG layer 168, and the second type semiconductor layer 140 can be made of different materials. In alternative embodiments, the buffer layer 162, the ELOG layer 168, and the second type semiconductor layer 140 can be made of the same material.

Figure 2D:
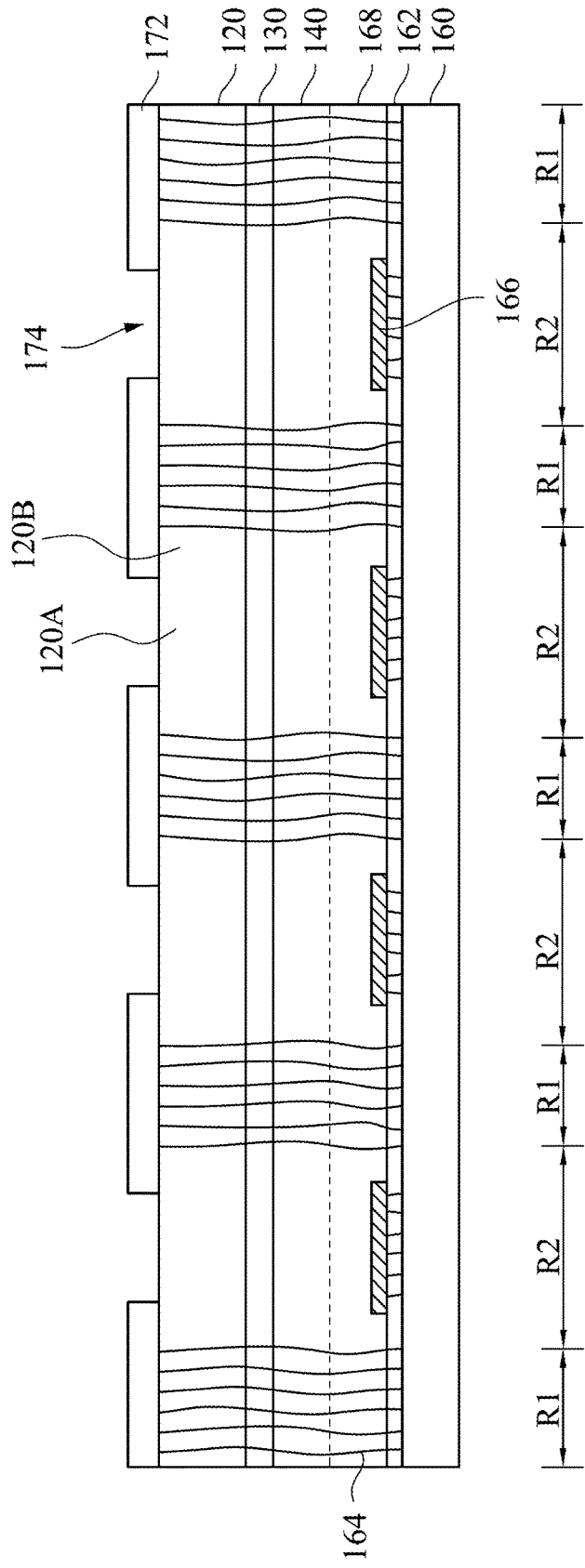

As shown in FIG. 2D, a first mask layer 172 is formed on the first type semiconductor layer 120. The first mask layer 172 has a plurality of openings 174 therein to expose the first type semiconductor layer 120, and the first type semiconductor layer 120 is divided into an exposed portion 120A and a covered portion 120B. In some embodiments, the first mask layer 172 is made of metal, such as titanium. Then, a heating process is performed to remove the hydrogen in the first type semiconductor layer 120, such that the conductivity of the first type semiconductor layer 120 increases. In some embodiments, the first type semiconductor layer 120 is heated with a temperature in a range from about 600° C. to about 800° C.

An interaction involving nitrogen vacancy may occur. Since the titanium in the first mask layer 172 is apt to combine with the nitrogen in the first type semiconductor layer 120 to form titanium nitride (TiNx), the nitrogen vacancy may be formed in the first type semiconductor layer 120. Therefore, the covered portion 120B may have the nitrogen vacancy density higher than that of the exposed portion 120A. Accordingly, the resistivity of the first type semiconductor layer 120 increases from the exposed portion 120A toward the covered portion 120B. In some embodiments, the gradient of the resistivity of the covered portion 120B in the longitudinal direction can vary through tuning the recipe, such as thickening the thickness of the first mask layer 172 or prolonging the period of the heating process. In some embodiments, after the heating process, the first mask layer 172 can be removed, and the first electrode layer 150 (see FIG. 1A) is formed on the first type semiconductor layer 120. In alternative embodiments, after the heating process, an insulating layer such as silicon dioxide can be conformally formed on the first type semiconductor layer 120 and the first mask layer 172, in which the insulating layer has a plurality of openings therein to expose the exposed portions 120A respectively, and the first electrode layer 150 is formed on the insulating layer to be electrically coupled with the first type semiconductor layer 120 through the openings of the insulating layer. Next, the structure illustrated in FIG. 2D can be transferred to a temporary substrate, processed by a suitable method such as chemical lift-off or laser lift-off (LLO) to remove the growth substrate 160 and the buffer layer 162, and then chipped in sequence. In alternative embodiments, the structure illustrated in FIG. 2D can be chipped and then transferred to a temporary substrate in sequence. After the transferring, the lift-off, and the chipping steps, the structure can be transferred to a receiving substrate to form the second electrode layer 152 (see FIG. 1A), and then the LED 100A of FIG. 1A is obtained. In this regard, as shown in FIGS. 1A and 2D, the exposed portion 120A of FIG. 2D corresponds to the low resistance portion 122 of FIG. 1A, and the covered portion 120B of FIG. 2D corresponds to the high resistance portion 124 of FIG. 1A.

Figure 3:
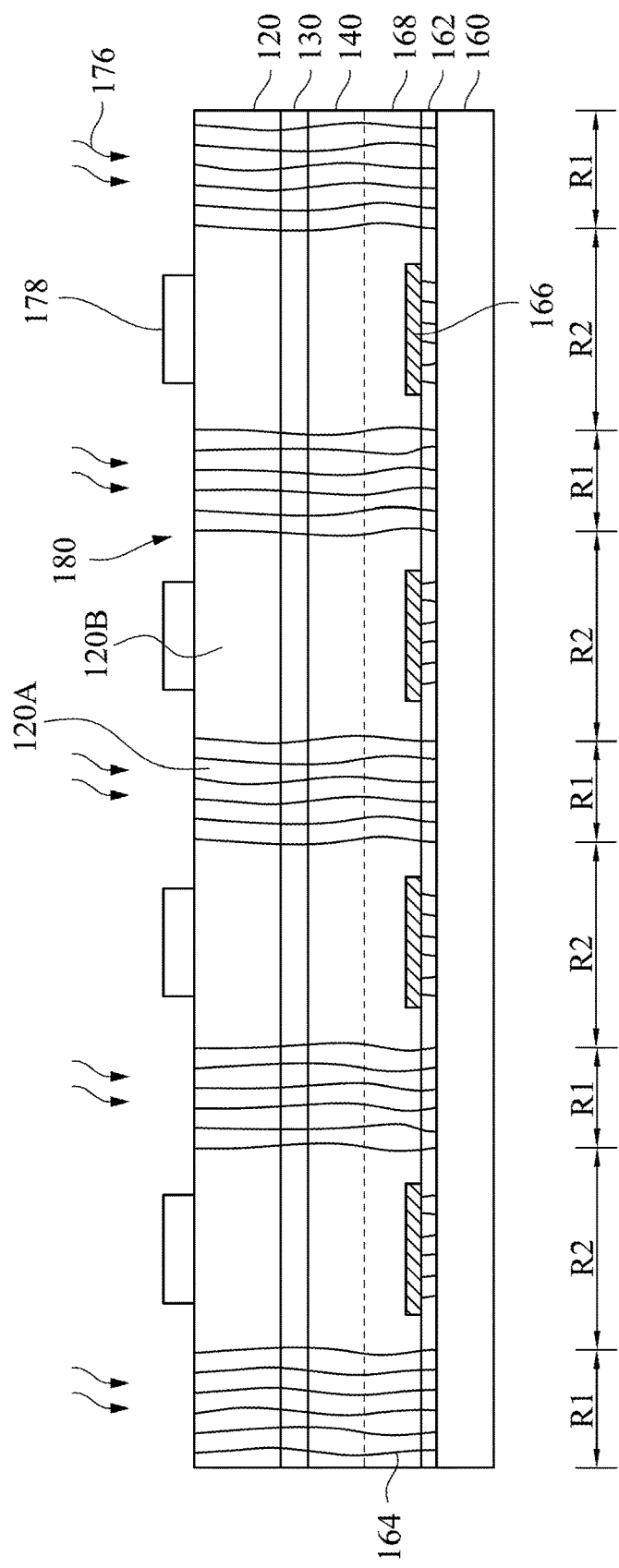
FIG. 3 is a cross-sectional view of an LED at an intermediate stage of a method for manufacturing the same according to some embodiments of the present disclosure.

FIG. 3 is a cross-sectional view of an LED at an intermediate stage of a method for manufacturing the same according to some embodiments of the present disclosure. The LED 100A of FIG. 1A can be manufactured by the following steps as well. The steps performed before the steps illustrated in FIG. 3 are similar to those in the steps illustrated in FIGS. 2A-2C, and they are not repeated herein. The difference between the steps illustrated in FIG. 3 and the steps illustrated in FIG. 2D is that inactivating agent 176 is introduced. In some embodiments, the inactivating agent 176 may include ammonia (NH3).

As shown in FIG. 3, a heating process can be performed to remove the hydrogen in the first type semiconductor layer 120 to improve the conductivity thereof, and thus the heating process can be taken as an activating process in this embodiment. Then, a second mask layer 178 is formed on the first type semiconductor layer 120. The second mask layer 178 has a plurality of openings 180 therein to expose the first type semiconductor layer 120, and the first type semiconductor layer 120 is divided into an exposed portion 120A and a covered portion 120B. In some embodiments, the second mask layer 178 is made of metal, such as nickel. Next, the inactivating agent 176 is introduced to increase the resistivity of the exposed portion 120A, while the resistivity of the covered portion 120B is kept the same. In other words, the inactivating agent 176 is introduced to inactivate the exposed portion 120A, and thus introducing the inactivating agent 176 can be taken as an inactivating process in this embodiment. In some embodiments, the carrier concentration of the covered portion 120B may be greater than that of the exposed portion 120A, in which the carrier concentration may be hole concentration or electron concentration. Accordingly, the resistivity of the first type semiconductor layer 120 increases from the covered portion 120B toward the exposed portion 120A. In some embodiments, the gradient of the resistivity of the exposed portion 120A in the longitudinal direction can vary through tuning the recipe, such as prolonging the period of the inactivating process. In some embodiments, after introducing the inactivating agent 176, the second mask layer 178 can be removed. As shown in FIGS. 1A and 3, the covered portion 120B of FIG. 3 corresponds to the low resistance portion 122 of FIG. 1A, and the exposed portion 120A of FIG. 3 corresponds to the high resistance portion 124 of FIG. 1A.

Figure 4:
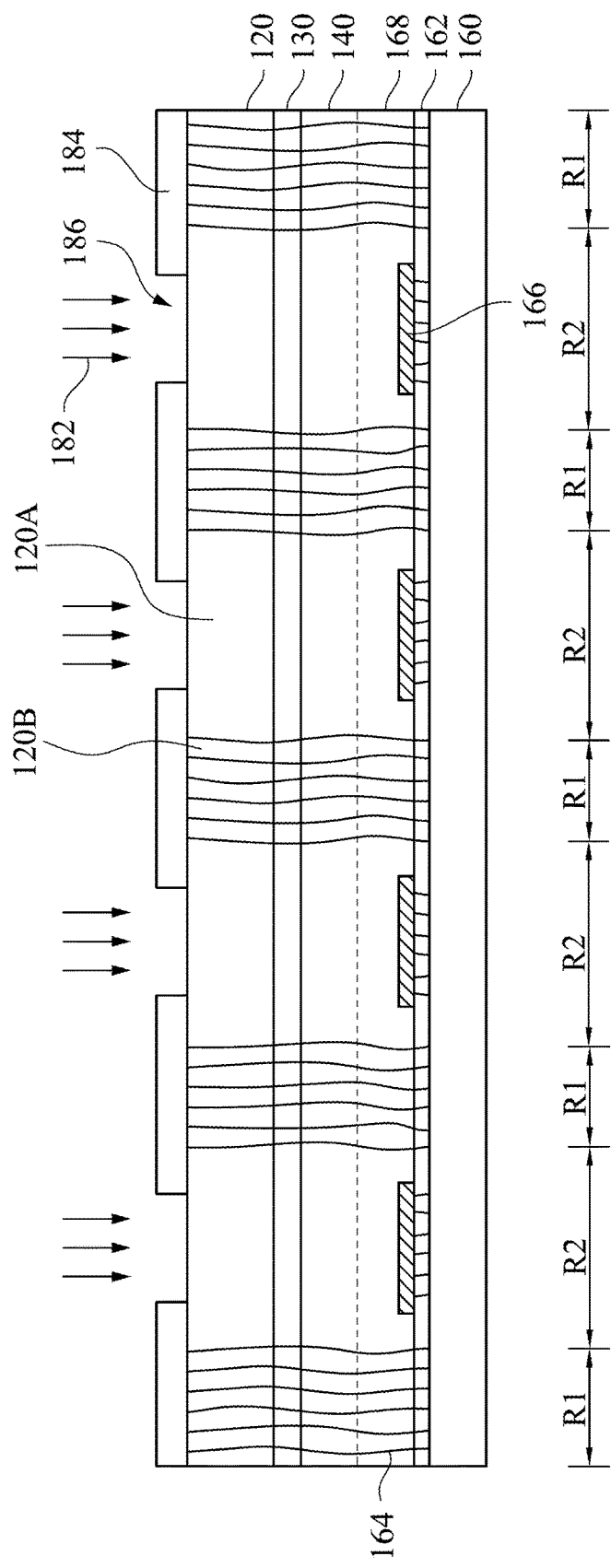
FIG. 4 is cross-sectional view of an LED at an intermediate stage of a method for manufacturing the same according to some embodiments of the present disclosure.

FIG. 4 is cross-sectional view of an LED at an intermediate stage of a method for manufacturing the same according to some embodiments of the present disclosure. The LED 100A of FIG. 1A can be manufactured by the following steps as well. The steps performed before the steps illustrated in FIG. 4 are similar to those in the steps illustrated in FIGS. 2A-2C, and they are not repeated herein. The difference between the steps illustrated in FIG. 4 and the steps illustrated in FIG. 2D is that activating irradiation 182 is introduced. In some embodiments, the activating irradiation 182 includes an electron beam, a laser, ultraviolet light, or combinations thereof.

As shown in FIG. 4, a third mask layer 184 is formed on the first type semiconductor layer 120. The third mask layer 184 has a plurality of openings 186 therein to expose the first type semiconductor layer 120, and the first type semiconductor layer 120 is divided into an exposed portion 120A and a covered portion 120B. In some embodiments, the third mask layer 184 is made of a photo-resist material or a dielectric material, such as silicon nitride or silicon dioxide. Next, the activating irradiation 182 is introduced to remove the hydrogen in the first type semiconductor layer 120, such that the conductivity of the exposed portion 120A is improved, while the conductivity of the covered portion 120B is kept the same. In some embodiments, after introducing the activating irradiation 182, the third mask layer 184 can be removed. As shown in FIGS. 1A and 4, the exposed portion 120A of FIG. 4 corresponds to the low resistance portion 122 of FIG. 1A, and the covered portion 120B of FIG. 4 corresponds to the high resistance portion 124 of FIG. 1A.

Figure 5:
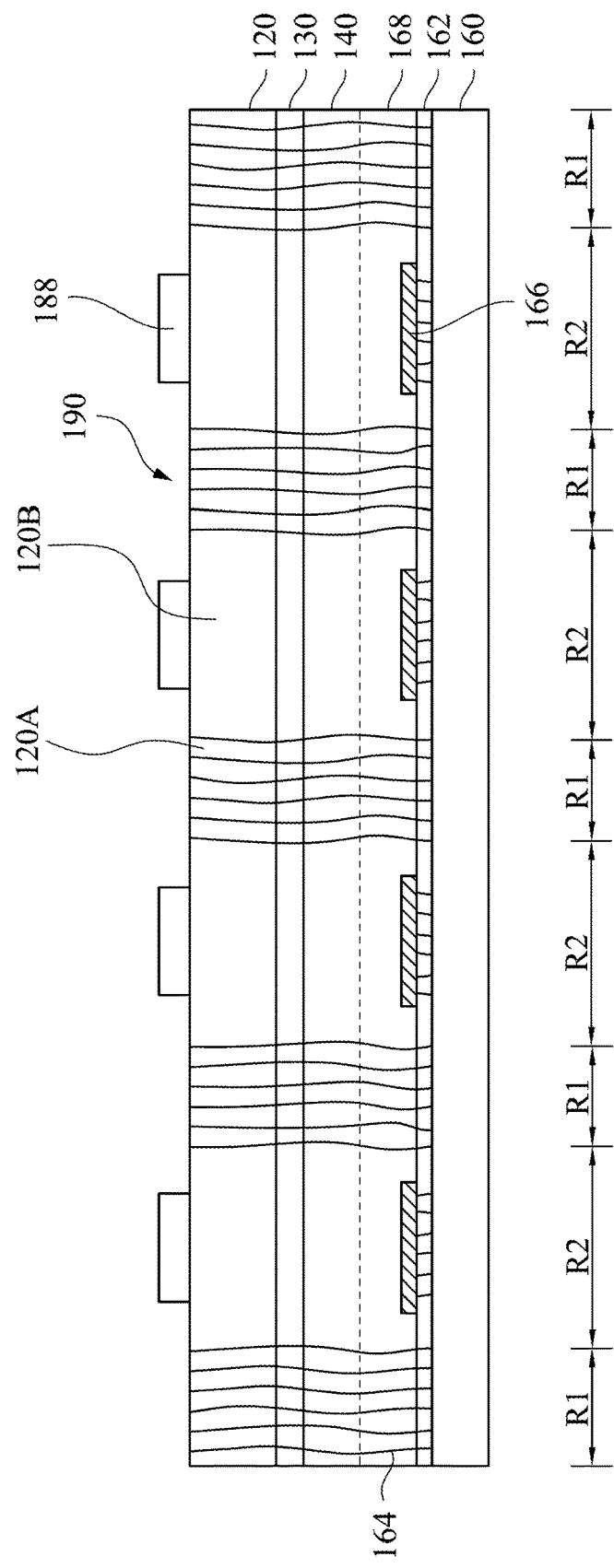
FIG. 5 is cross-sectional view of an LED at an intermediate stage of a method for manufacturing the same according to some embodiments of the present disclosure.

FIG. 5 is a cross-sectional view of an LED at an intermediate stage of a method for manufacturing the same according to some embodiments of the present disclosure. The LED 100A of FIG. 1A can be manufactured by the following steps as well. The steps performed before the steps illustrated in FIG. 5 are similar to those in the steps illustrated in FIGS. 2A-2C, and they are not repeated herein. The difference between the steps illustrated in FIG. 5 and the steps illustrated in FIG. 2D is that a catalytic mechanism is introduced.

As shown in FIG. 5, a fourth mask layer 188 is formed on the first type semiconductor layer 120. The fourth mask layer 188 has a plurality of openings 190 therein to expose the first type semiconductor layer 120, and the first type semiconductor layer 120 is divided into an exposed portion 120A and a covered portion 120B. In some embodiments, the fourth mask layer 188 is made of nickel to serve as a catalysis layer. Due to the catalytic mechanism, the hydrogen in the covered portion 120B can be removed in a temperature lower than that in the exposed portion 120A. That is, performing the heating process in a certain temperature can remove the hydrogen in the covered portion 120B, and the hydrogen in the exposed portion 120A is remained the same. Therefore, the resistivity of the covered portion 120B decreases, and the resistivity of the exposed portion 120A is kept the same. In some embodiments, after the heating process, the fourth mask layer 188 can be removed. As shown in FIGS. 1A and 5, the covered portion 120B of FIG. 5 corresponds to the low resistance portion 122 of FIG. 1A, and the exposed portion 120A of FIG. 5 corresponds to the high resistance portion 124 of FIG. 1A.

Figure 6A:
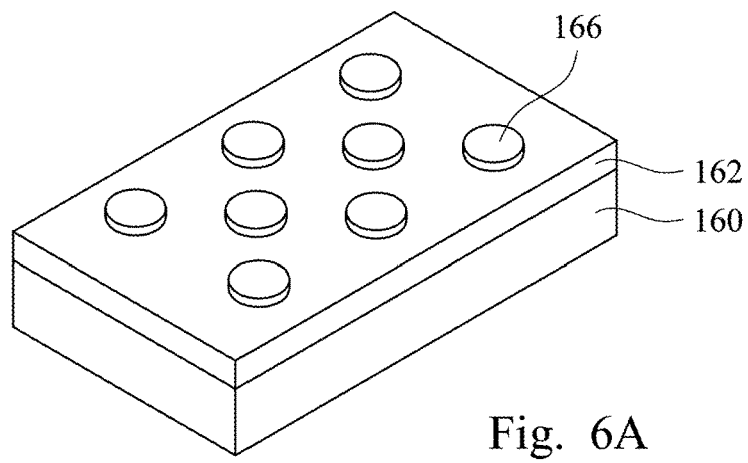
FIGS. 6A-6E are perspective views of dislocation-controlling features with various shape according to some embodiments of the present disclosure.
Figure 6B:
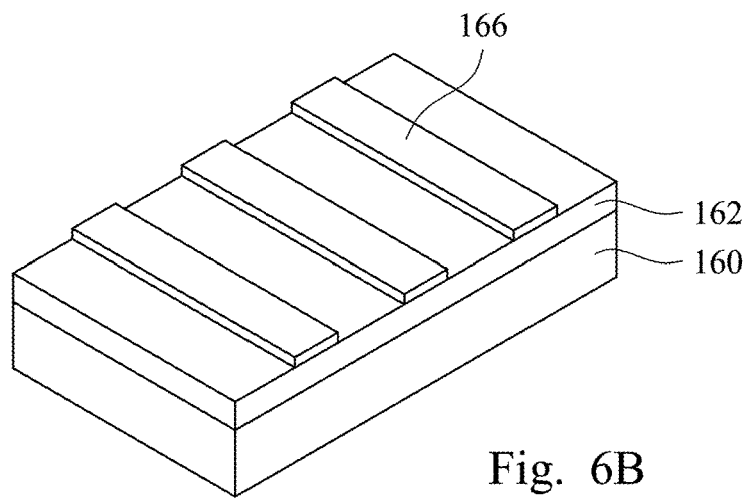
Figure 6C:
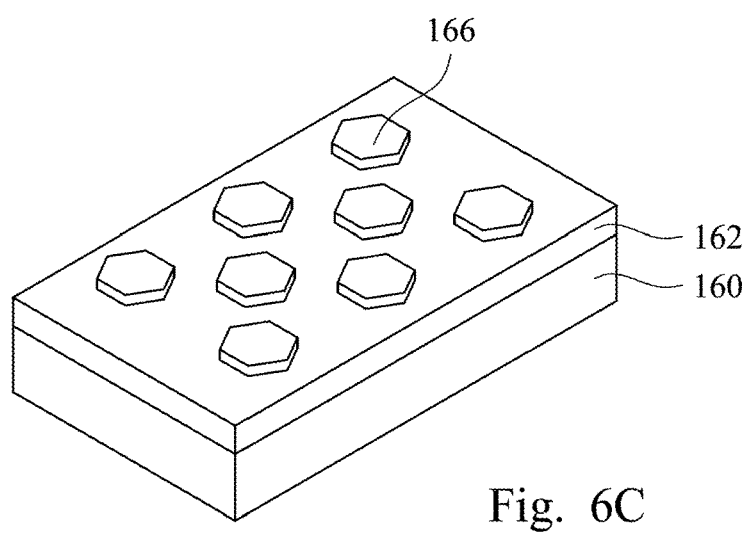
Figure 6D:
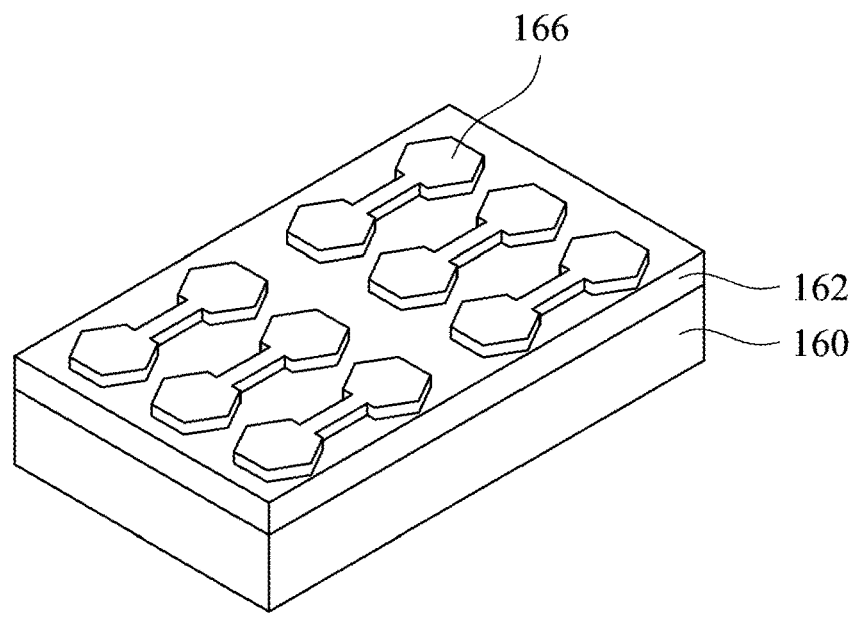
Figure 6E:
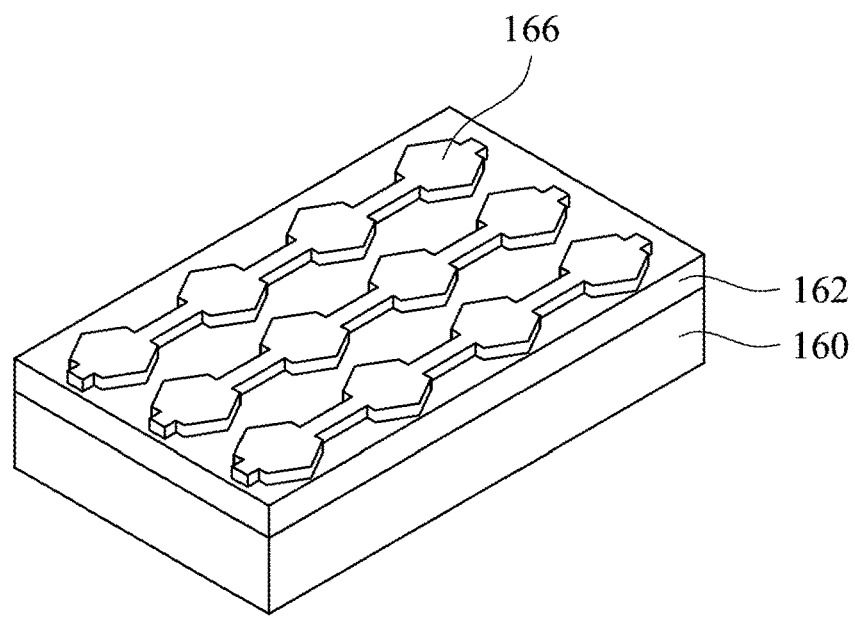

In some embodiments, the shape of the at least one of the dislocation-controlling features 166 can varied. For example, FIGS. 6A-6E are perspective views of dislocation-controlling features 166 with various shape according to some embodiments of the present disclosure. As shown in FIGS. 6A-6C, the dislocation-controlling features 166 may be circular, strip-shaped, zig-zag shaped, or polygonal. As shown in FIGS. 6D-6E, the dislocation-controlling features 166 may form a patterned interlayer.

Figure 7:
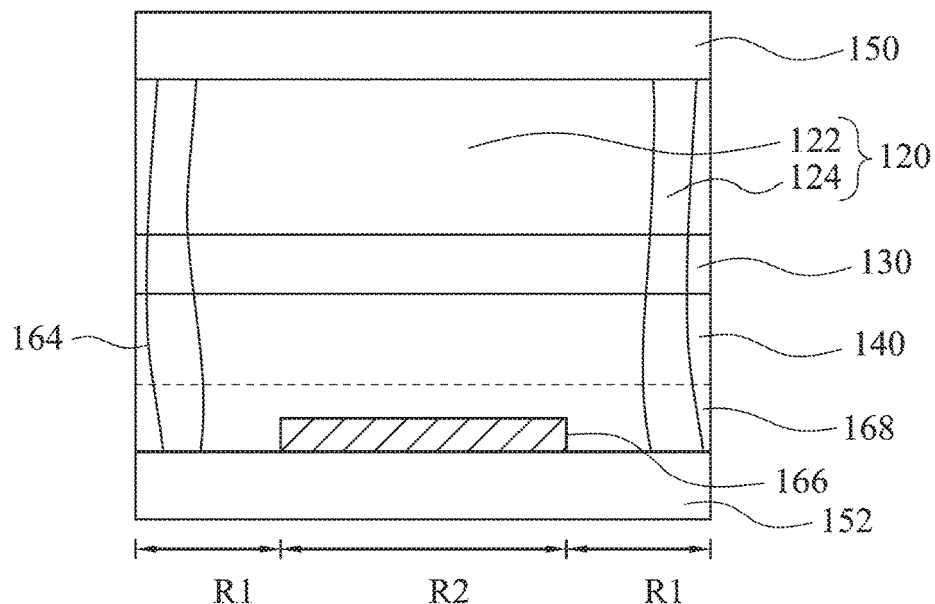
FIG. 7 is a cross-sectional view of an LED according to a second embodiment of the present disclosure.

FIG. 7 is a cross-sectional view of an LED 100B according to a second embodiment of the present disclosure. The difference between the LED 100B of the present embodiment and the LED 100A of the first embodiment is that a dislocation-controlling feature 166 remains in the LED structure. The ELOG layer 168 and the dislocation-controlling feature 166 can remain in the manufacturing processes. In some embodiments, the dislocation-controlling feature 166 is reflective, and a vertical projection of the dislocation-controlling feature 166 on the first type semiconductor layer 120 at least partially overlaps with the low resistance portion 122. Since the dislocation-controlling feature 166 is reflective, the light emitted from the active layer 130 toward the dislocation-controlling feature 166 can be reflected back, such that the light extraction efficiency of the LED 100B can be enhanced.

Figure 8:
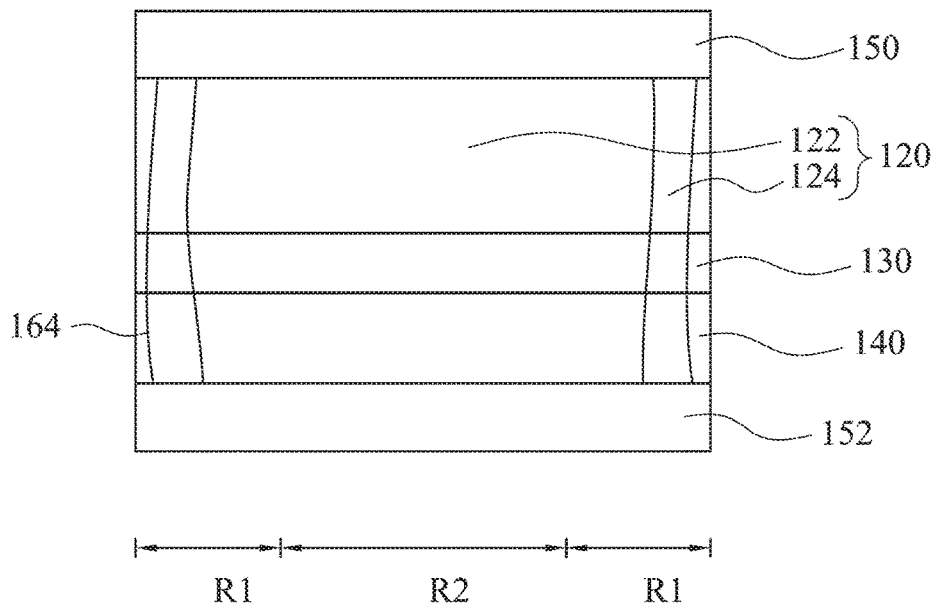
FIG. 8 is a cross-sectional view of an LED according to a third embodiment of the present disclosure.

FIG. 8 is a cross-sectional view of an LED 100C according to a third embodiment of the present disclosure. The difference between the LED 100C of the present embodiment and the LED 100A of the first embodiment is that the first region R1 and the second region R2 of the active layer 130 are formed by a dislocation-reduction feature. The threading dislocation of the first region R1 is greater than that of the second region R2, and the vertical projection of the low resistance portion 122 on the active layer 130 at least partially overlaps with the second region R2 as well.

FIGS. 9A-9C are cross-sectional views of an LED at an intermediate stage of a method for manufacturing the same according to some embodiments of the present disclosure. The LED 100C of FIG. 8 can be manufactured by the following steps.

As shown in FIGS. 9A and 9B, dislocation-controlling features 166 are formed on a growth substrate 160, in which each of the dislocation-controlling features 166 of the present embodiment is a dislocation-reduction feature. A buffer layer 162 is formed on the growth substrate 160 and the dislocation-controlling features 166. Due to the lattice mismatch between the growth substrate 160 and the buffer layer 162, a tensile stress may be produced. The tensile stress is produced especially in the places where the dislocation-controlling features 166 located, and thus the threading dislocations 164 is apt to obliquely originate from the dislocation-controlling features 166. Furthermore, in some embodiments, a combination of the growth substrate 160 and the dislocation-controlling features 166 may be a patterned sapphire substrate. In some embodiments, the growth substrate 160 may be made of, for example, Si, SiC, ZnO, InP, AlN, GaP, and GaN, etc. The buffer layer 162 is made of a doped or undoped material such as GaN, AlN, AlGaN, InGaN, and InAlGaN, etc., so as to reduce the lattice mismatch with the growth substrate 160.

As shown in FIG. 9C, a second type semiconductor layer 140 is formed on the buffer layer 162. An active layer 130 is formed on the second type semiconductor layer 140, and a first type semiconductor layer 120 is formed on the active layer 130. The threading dislocations 164 may obliquely propagate into the layers formed on the buffer layer 162 such that a first region R1 and a second region R2 are at least caused in the active layer 130, and the threading dislocation density of the first region R1 is greater than that of the second region R2. In some embodiments, after the first type semiconductor layer 120 is formed, the step for changing the resistivity of the first type semiconductor layer 120 is performed, in which this step can be selected from at least one of the steps stated above.

Figure 10:
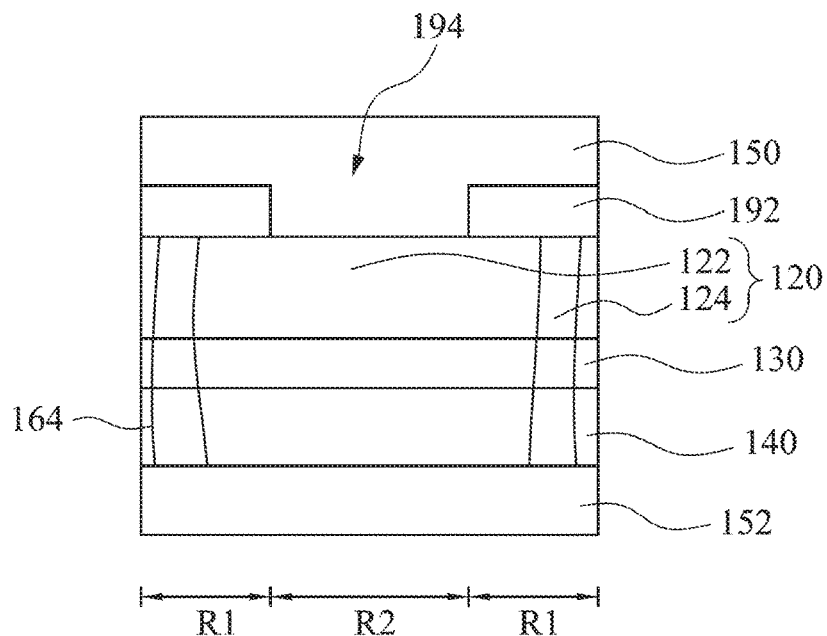
FIG. 10 is a cross-sectional view of an LED according to a fourth embodiment of the present disclosure.

FIG. 10 is a cross-sectional view of an LED 100D according to a fourth embodiment of the present disclosure. The difference between the LED 100D of the present embodiment and the LED 100A of the first embodiment is that the LED 100D further includes a current control layer 192 joined with the first type semiconductor layer 120, in which the current control layer 192 has at least one opening 194 therein. In some embodiments, the current control layer 192 is a dielectric layer which is made of a dielectric material, such as silicon nitride or silicon dioxide. In some embodiments, the first type semiconductor layer 120 and the second type semiconductor layer 140 form a first p-n junction, the current control layer 192 and the first type semiconductor layer 120 form a second p-n junction, and the first electrode layer 150 and the second electrode layer 152 are configured to forward bias the first p-n junction while reverse bias the second p-n junction. In some embodiments, the current control layer 192 is a semiconductor layer such that the first type semiconductor layer 120 and the current control layer 192 can form a Schottky barrier therebetween. In some embodiments, the current control layer 192 is one of a hole blocking layer and an electron blocking layer.

As shown in FIG. 10, the first type semiconductor layer 120 is present between the active layer 130 and the current control layer 192, and the first electrode layer 150 is electrically coupled with the first type semiconductor layer 120 through the opening 194. A vertical projection of the opening 194 on the active layer 130 at least partially overlaps the second region R2 and at least partially overlaps the vertical projection of the low resistance portion 122 on the active layer 130. The opening 194 can define a contact interface between the first electrode layer 150 and the first type semiconductor layer 120, and therefore the charge carriers flowing into the first type semiconductor layer 120 can be confined, thereby preventing the charge carriers from spreading.

In some embodiments, the current control layer 192 can be formed after changing the resistivity of the first type semiconductor layer 120, and then the first electrode layer 150 is formed on the current control layer 192. In some embodiments, the current control layer 192 can be joined with the second type semiconductor layer 140 as well, and the second type semiconductor layer 140 can be present between the active layer 130 and the current control layer 192. In alternative embodiments, two current control layers can be respectively joined with the first type semiconductor layer 120 and the second type semiconductor layer 140.

Figure 11:
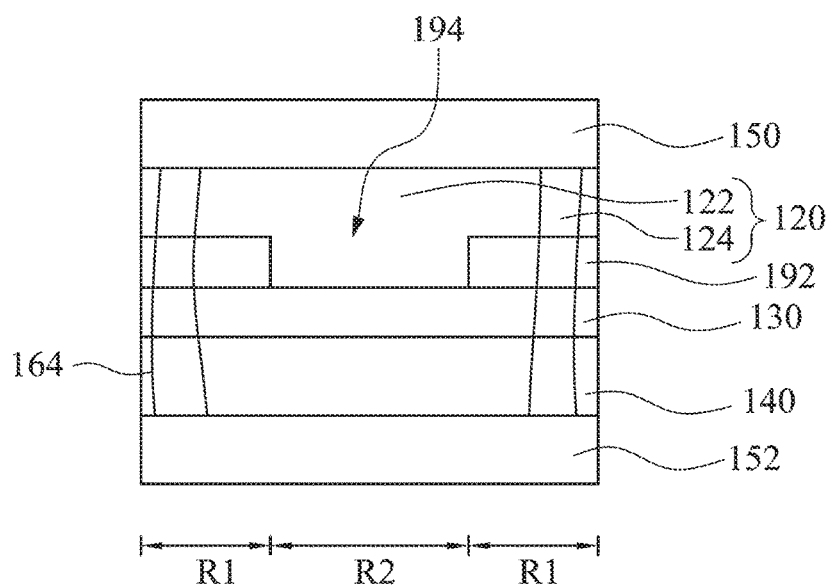
FIG. 11 is a cross-sectional view of an LED according to a fifth embodiment of the present disclosure.

FIG. 11 is a cross-sectional view of an LED 100E according to a fifth embodiment of the present disclosure. The difference between the LED 100E of the present embodiment and the LED 100D of the fourth embodiment is that the current control layer 192 of the present embodiment is present within the first type semiconductor layer 120 with being in contact with the active layer 130. In some embodiments, the current control layer 192 can be formed between the formations of the active layer 130 and the first type semiconductor layer 120.

Figure 12:
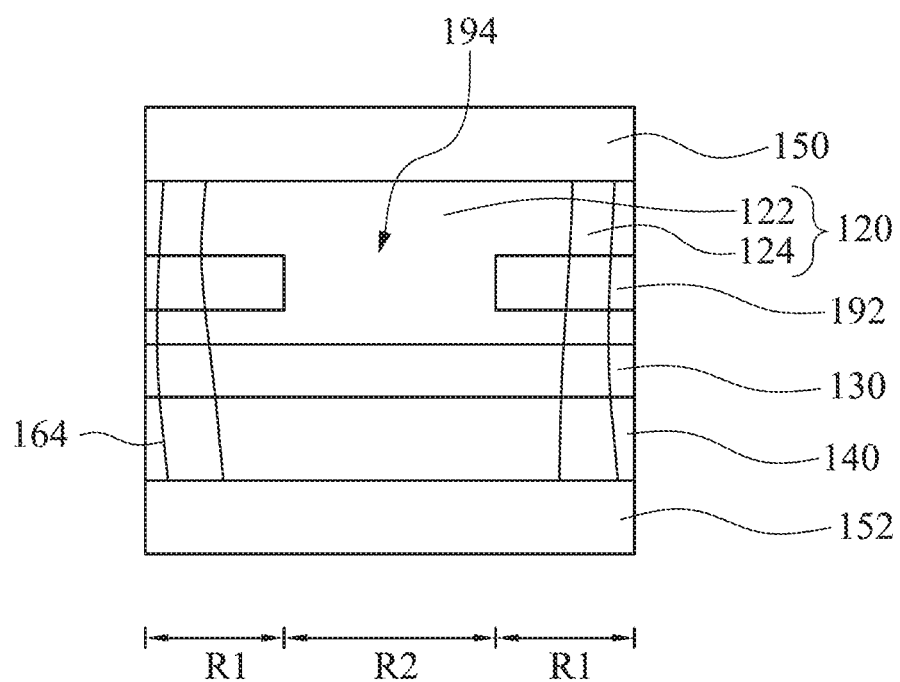
FIG. 12 is a cross-sectional view of an LED according to a sixth embodiment of the present disclosure.

FIG. 12 is a cross-sectional view of an LED 100F according to a sixth embodiment of the present disclosure. The difference between the LED 100F of the present embodiment and the LED 100D of the fourth embodiment is that the current control layer 192 of the present embodiment is present within the first type semiconductor layer 120 without being in contact with the active layer 130. The current control layer 192 is separated from the active layer 130 by at least a portion of the first type semiconductor layer 120. The portion of the first type semiconductor layer 120 can serve a protect layer for the active layer 130 during the formation of the current control layer 192. In some embodiment, the current control layer 192 can be formed during the formation of the first type semiconductor layer 120.

In some embodiments, the current control layer 192 can be present within the second type semiconductor layer 140 as well, and the current control layer 192 can be disposed to be in contact with the active layer or be separated from the active layer 130 by at least a portion of the second type semiconductor layer 140. In alternative embodiments, two current control layers can be respectively be present within the first type semiconductor layer 120 and the second type semiconductor layer 140. Furthermore, the current control layer 192 can be disposed to join with the first type semiconductor layer 120, join with the second type semiconductor layer 140, be present within the first type semiconductor layer 120 or be present within the second type semiconductor layer 140, and the different dispositions of the current control layer 192 are independent of each other.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A light-emitting diode (LED), comprising:
   a first type semiconductor layer comprising a low resistance portion and a high resistance portion, wherein the low resistance portion is separated from at least one edge of the first type semiconductor layer by the high resistance portion, the resistivity of the first type semiconductor layer increases from the low resistance portion toward the high resistance portion, and a local minimum value of the resistivity of the first type semiconductor layer is present within the low resistance portion;
   a second type semiconductor layer, wherein the first type semiconductor layer is disposed on the second type semiconductor layer; and
   an active layer disposed between the first type semiconductor layer and the second type semiconductor layer, wherein the active layer has a first region and a second region, wherein the first region has a threading dislocation density greater than that of the second region, and a vertical projection of the low resistance portion on the active layer at least partially overlaps with the second region.

2. The LED of claim 1, wherein the high resistance portion has a top surface facing away from the active layer, and the resistivity of the high resistance portion near the top surface is greater than or equal to that of the high resistance portion near the active layer.

3. The LED of claim 1, wherein the resistivity of the first type semiconductor layer horizontally gradually increases from the low resistance portion toward the high resistance portion.

4. The LED of claim 1, wherein a vertical projection of a top surface of the low resistance portion on the active layer is present within the second region.

5. The LED of claim 1, wherein the high resistance portion has a top surface facing away from the active layer, and the resistivity of the high resistance portion gradually decreases from the top surface toward the active layer.

6. The LED of claim 1, further comprising:
an electrode layer electrically coupled with the first type semiconductor layer, wherein surfaces of the low resistance portion and the high resistance portion facing away from the active layer are at least covered with the electrode layer.

7. The LED of claim 1, wherein the first type semiconductor layer is made of a p-type doped semiconductor material, and the second type semiconductor layer is made of an n-type semiconductor material.

8. The LED of claim 1, further comprising:
an epitaxial lateral overgrowth (FLOG) layer, wherein the second type semiconductor layer is disposed on the FLOG layer; and
at least one dislocation-controlling feature disposed in the FLOG layer, wherein the dislocation-controlling feature is reflective, and a vertical projection of the dislocation-controlling feature on the first type semiconductor layer at least partially overlaps with the low resistance portion.

9. The LED of claim 1, further comprising:
at least one current control layer having at least one opening therein, wherein a vertical projection of the opening on the active layer at least partially overlaps with the second region.

10. The LED of claim 9, wherein the vertical projection of the opening on the active layer at least partially overlaps with the vertical projection of the low resistance portion on the active layer.

11. The LED of claim 10, wherein the current control layer is joined with the first type semiconductor layer, and first type semiconductor layer is present between the active layer and the current control layer.

12. The LED of claim 10, further comprising:
an electrode layer joined with the current control layer and electrically coupled with the first type semiconductor layer through the opening of the current control layer.

13. The LED of claim 10, wherein the current control layer is joined with the second type semiconductor layer, and the second type semiconductor layer is present between the active layer and the current control layer.

14. The LED of claim 10, wherein the current control layer is present within the first type semiconductor layer.

15. The LED of claim 10, wherein the current control layer is present within the second type semiconductor layer.

16. A method for manufacturing a light-emitting diode (LED), the method comprising:
forming at least one dislocation-controlling feature on a substrate;
forming a first type semiconductor layer on the dislocation-controlling feature;
forming an active layer on the first type semiconductor layer, wherein the active layer has a first region and a second region, and the dislocation-controlling feature causes a threading dislocation density of the first region to be greater than that of the second region;
forming a second type semiconductor layer on the active layer; and
changing the resistivity of the second type semiconductor layer after forming a combination of the dislocation-controlling feature, the first type semiconductor layer, and the active layer, so as to make the resistivity of second type semiconductor layer increases from a low resistance portion toward a high resistance portion of the second type semiconductor layer.

17. The method of claim 16, wherein the dislocation-controlling feature is a dislocation-blocking feature.

18. The method of claim 16, wherein the dislocation-controlling feature is a dislocation-reduction feature.

* * * * *